US010930723B2

(12) United States Patent
Shim et al.

(10) Patent No.: US 10,930,723 B2
(45) Date of Patent: Feb. 23, 2021

(54) DISPLAY DEVICE

(71) Applicant: LG Display Co., Ltd., Seoul (KR)

(72) Inventors: JongSik Shim, Paju-si (KR);
SeongHwan Hwang, Seoul (KR);
KilHwan Oh, Seoul (KR)

(73) Assignee: LG DISPLAY CO., LTD., Seoul (KR)

( * ) Notice: Subject to any disclaimer, the term of this patent is extended or adjusted under 35 U.S.C. 154(b) by 75 days.

(21) Appl. No.: 16/209,436

(22) Filed: Dec. 4, 2018

(65) Prior Publication Data

US 2019/0172884 A1 Jun. 6, 2019

(30) Foreign Application Priority Data

Dec. 6, 2017 (KR) .......................... 10-2017-0166456

(51) Int. Cl.
*H01L 27/32* (2006.01)
*H01L 27/12* (2006.01)
*H01L 29/45* (2006.01)
*H01L 29/417* (2006.01)

(52) U.S. Cl.
CPC ........ *H01L 27/3262* (2013.01); *H01L 27/124* (2013.01); *H01L 27/1248* (2013.01); *H01L 27/1255* (2013.01); *H01L 27/1288* (2013.01); *H01L 27/322* (2013.01); *H01L 27/3248* (2013.01); *H01L 27/3258* (2013.01); *H01L 27/3265* (2013.01); *H01L 27/3272* (2013.01); *H01L 27/3276* (2013.01); *H01L 29/41733* (2013.01); *H01L 29/45* (2013.01); *H01L 29/458* (2013.01); *H01L 2227/323* (2013.01)

(58) Field of Classification Search
None
See application file for complete search history.

(56) References Cited

U.S. PATENT DOCUMENTS

| 2003/0127650 A1 | 7/2003 | Park et al. |
| 2007/0139571 A1 | 6/2007 | Kimura |
| 2007/0295967 A1 | 12/2007 | Harada et al. |

(Continued)

FOREIGN PATENT DOCUMENTS

| KR | 10-2010-0090998 A | 8/2010 |
| KR | 10-2013-0042066 A | 4/2013 |

(Continued)

*Primary Examiner* — Erik Kielin
(74) *Attorney, Agent, or Firm* — Seed IP Law Group LLP

(57) ABSTRACT

A display device is disclosed. The display device according to an exemplary embodiment of the present disclosure includes: a substrate including an active area and a non-active area; an active layer, a thin film transistor including a gate electrode, a source electrode, and a drain electrode disposed on the substrate; and an organic light emitting diode including an anode which is electrically connected to the thin film transistor, in which the gate electrode, the source electrode, and the drain electrode are formed of a first conductive layer and a second conductive layer on the first conductive layer and the anode is formed of the same material as the first conductive layer. Therefore, the anode and the first conductive layer of the drain electrode are integrally connected so that a separate contact hole for electrically connecting the anode and the drain electrode is not necessary and the structure may be simplified.

15 Claims, 13 Drawing Sheets

(56) References Cited

U.S. PATENT DOCUMENTS

| | | | |
|---|---|---|---|
| 2011/0012112 A1* | 1/2011 | Yamazaki | H01L 27/1251 257/57 |
| 2011/0050604 A1* | 3/2011 | Kwon | H01L 27/323 345/173 |
| 2012/0146886 A1* | 6/2012 | Minami | H01L 27/3276 345/80 |
| 2015/0060806 A1* | 3/2015 | Park | H01L 51/5253 257/40 |
| 2015/0187279 A1* | 7/2015 | Lee | H01L 51/56 257/40 |
| 2016/0163769 A1* | 6/2016 | Lee | H01L 27/3246 257/40 |
| 2017/0294464 A1* | 10/2017 | Kwon | H01L 27/1225 |

FOREIGN PATENT DOCUMENTS

| | | |
|---|---|---|
| KR | 10-2014-0083852 A | 7/2014 |
| KR | 10-2014-0084603 A | 7/2014 |
| KR | 10-2015-0028055 A | 3/2015 |
| KR | 10-2016-0012876 A | 2/2016 |
| KR | 10-2016-0039092 A | 4/2016 |
| KR | 10-2016-0041098 A | 4/2016 |
| KR | 10-2017-0077371 A | 7/2017 |
| KR | 10-2017-0079541 A | 7/2017 |
| KR | 10-2009-0058283 A | 12/2018 |

\* cited by examiner

DISPLAY DEVICE

CROSS-REFERENCE TO RELATED APPLICATIONS

This application claims the priority of Korean Patent Application No. 10-2017-0166456 filed on Dec. 6, 2017, in the Korean Intellectual Property Office, the disclosure of which is incorporated herein by reference.

BACKGROUND

Technical Field

The present disclosure relates to a display device and a manufacturing method of a display device, and more particularly, to a display device and a manufacturing method of a display device which may reduce the number of masks used for a manufacturing process of a display device by simplifying a structure of a display device.

Description of the Related Art

Recently, as it enters an information era, a display field which visually expresses electrical information signals has been rapidly developed and in response to this, various display devices having excellent performances such as thin-thickness, light weight, and low power consumption have been developed. Examples of such a display device include a liquid crystal display device (LCD) and an organic light emitting display device (OLED).

Such display devices include a substrate including a plurality of thin film transistors and a display element for driving. In this case, the display element may vary depending on a type of display device. For example, a display element used for an organic light emitting display device may be an organic light emitting diode. In a manufacturing process of such a display device, in order to form a thin film transistor, a display element, and wiring lines on a substrate, a conductive material or an insulating material is formed and a mask process for patterning the conductive material or the insulating material is performed several times. In this case, when the number of masks used therefor is increased, the manufacturing cost is increased and a manufacturing time is also increased.

BRIEF SUMMARY

An object to be achieved by the present disclosure is to provide a display device which forms a gate electrode, a source electrode, and a drain electrode of a thin film transistor and an anode by one mask process, thereby reducing the number of mask processes and reducing the manufacturing cost and time.

Another object to be achieved by the present disclosure is to provide a display device which forms a passivation layer and a bank by a single mask process to reduce the number of mask processes and simplify a manufacturing process.

Objects of the present disclosure are not limited to the above-mentioned objects, and other objects, which are not mentioned above, can be clearly understood by those skilled in the art from the following descriptions.

According to an aspect of the present disclosure, a display device includes: a substrate including an active area and a non-active area, a thin film transistor including an active layer, a gate electrode, a source electrode, and a drain electrode disposed on the substrate; and an organic light emitting diode including an anode which is electrically connected to the thin film transistor in which the gate electrode, the source electrode, and the drain electrode are formed of a first conductive layer and a second conductive layer on the first conductive layer and the anode is formed of the same material as the first conductive layer. Therefore, the anode and the first conductive layer of the drain electrode are integrally formed so that a separate contact hole which electrically connects the anode and the drain electrode is not necessary and thus the structure may be simplified.

According to another aspect of the present disclosure, a manufacturing method of a display device includes: forming an active layer of a thin film transistor in an active area, on a substrate including the active area and a non-active area; forming a gate insulating layer on the active layer; sequentially forming a first conductive material and a second conductive material on the gate insulating layer; and forming a gate electrode, a source electrode, and a drain electrode of the thin film transistor which are formed of a first conductive layer and a second conductive layer on the first conductive layer, on the active layer by etching the first conductive material and the second conductive material and forming an anode of an organic light emitting diode which is formed of the same material as the first conductive layer. Therefore, the gate electrode, the source electrode, and the drain electrode, and the anode are formed by one mask process, thereby reducing the number of mask processes and reducing the manufacturing cost and time.

In one or more embodiments, the first conductive material may be a transparent conductive material and the second conductive material may be a metallic material.

In one or more embodiments, the forming of the gate electrode, the source electrode, and the drain electrode of the thin film transistor and the anode may include integrally forming the anode and the first conductive layer of the source electrode or the drain electrode.

In one or more embodiments, the manufacturing method may further comprise: forming a data line between the substrate and the active layer in the active area, wherein the forming of the gate electrode, the source electrode, and the drain electrode of the thin film transistor and the anode includes forming a pad electrode which is electrically connected to the data line and is formed of the first conductive material in the non-active area.

In one or more embodiments, the forming of the data line may include forming a light shielding layer which is formed of the same material as the data line in an area overlapping the active layer.

In one or more embodiments, the forming of the gate insulating layer may include: sequentially forming a gate insulating material and a planarization material on the active layer; forming a planarization layer by etching the planarization material in the non-active area and an area overlapping the thin film transistor; and forming the gate insulating layer in an area where the planarization material is etched by etching the gate insulating material in an area where the active layer is in contact with the source electrode and the drain electrode, and the forming of the gate electrode, the source electrode, and the drain electrode of the thin film transistor and the anode includes forming the anode on the planarization layer.

In one or more embodiments, the sequentially forming of the gate insulating material and the planarization material may include: forming the gate insulating material on the active layer; forming a color filter on the gate insulating material in an area overlapping the organic light emitting diode; and forming the planarization material on the color filter.

In one or more embodiments, the manufacturing method may further comprise: sequentially forming a passivation material and a bank material on the thin film transistor and the anode; forming a bank by etching the bank material in an area overlapping at least a partial area of the anode and an area overlapping the non-active area; and forming a passivation layer by etching the passivation material in an area overlapping at least a partial area of the anode.

In one or more embodiments, the planarization layer may include: a first planarization layer disposed between the substrate and the anode in an area of the active area excluding an area where the thin film transistor is disposed; and a second planarization layer disposed in the non-active area, wherein the first planarization layer and the second planarization layer are spaced apart from each other.

In one or more embodiments, the second planarization layer may be an island shape.

In one or more embodiments, the second planarization layer may be disposed at intersections of wiring lines in the non-active area.

In one or more embodiments, the manufacturing method may further comprise: forming a first capacitor electrode on the substrate and forming a buffer layer on the first capacitor electrode, wherein a partial area of the active layer which overlaps the first capacitor electrode is conducted and serves as a second capacitor electrode, and the remaining part of the active layer which does not overlap the first capacitor electrode and is not conducted serves as the active layer of the thin film transistor.

In one or more embodiments, the forming of the gate insulating layer may include: etching a gate insulating material and the buffer layer below the gate insulating material by using a halftone mask to simultaneously form the gate insulating layer and a contact hole of the buffer layer.

According to another aspect of the present disclosure, a manufacturing method of a display device comprises: forming an active layer of a thin film transistor in an active area, on a substrate including the active area and a non-active area; sequentially forming a first conductive material and a second conductive material on the active layer; and forming a gate electrode, a source electrode, and a drain electrode of the thin film transistor which are formed of a first conductive layer and a second conductive layer on the first conductive layer, on the active layer by etching the first conductive material and the second conductive material and forming an anode of an organic light emitting diode which is formed of the same material as the first conductive layer.

Other detailed matters of the embodiments are included in the detailed description and the drawings.

According to the present disclosure, a gate electrode, a source electrode, and a drain electrode of a thin film transistor and an anode of an organic light emitting diode are formed by a single mask process, thereby reducing the number of mask processes and the manufacturing cost.

According to the present disclosure, a passivation layer and a bank are formed by a single mask process, thereby reducing the number of mask processes and simplifying a manufacturing process.

According to the present disclosure, at intersections of a plurality of wiring lines disposed on a substrate, a planarization layer is disposed between wiring lines to reduce a short circuit between wiring lines and a distance spaced between the wiring lines is increased to reduce a parasitic capacitance.

The effects according to the present disclosure are not limited to the contents exemplified above, and more various effects are included in the present disclosure.

BRIEF DESCRIPTION OF THE SEVERAL VIEWS OF THE DRAWINGS

The above and other aspects, features and other advantages of the present disclosure will be more clearly understood from the following detailed description taken in conjunction with the accompanying drawings, in which.

DETAILED DESCRIPTION

Figure 1:
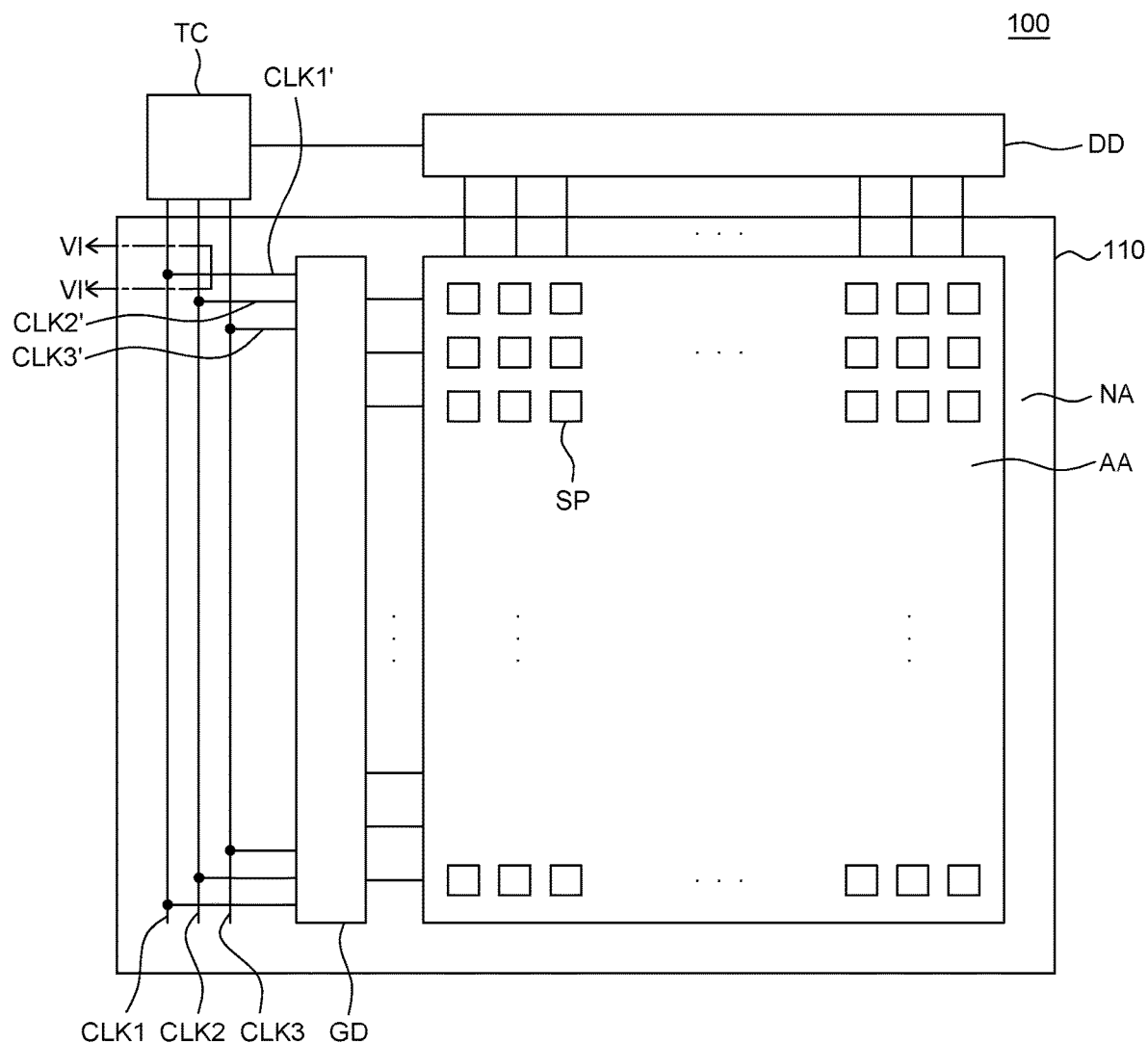
FIG. 1 is a plan view of a display device according to an exemplary embodiment of the present disclosure.

Advantages and characteristics of the present disclosure and a method of achieving the advantages and characteristics will be clear by referring to exemplary embodiments described below in detail together with the accompanying drawings. However, the present disclosure is not limited to the embodiments disclosed herein but will be implemented in various forms. The embodiments are provided by way of example only so that a person of ordinary skilled in the art can fully understand the disclosures of the present invention and the scope of the present disclosure. Therefore, the present disclosure will be defined only by the scope of the appended claims.

The shapes, sizes, ratios, angles, numbers, and the like illustrated in the accompanying drawings for describing the exemplary embodiments of the present disclosure are merely examples, and the present disclosure is not limited thereto. In the following description, a detailed explanation of known related technologies may be omitted to avoid unnecessarily obscuring the subject matter of the present disclosure. The terms such as "including," "having," and "comprising" used herein are generally intended to allow other components to be added unless the terms are used with the term "only". Any references to singular may include plural unless expressly stated otherwise.

Components are interpreted to include an ordinary error range even if not expressly stated.

When the position relation between two parts is described using the terms such as "on", "above", "below", and "next", one or more parts may be positioned between the two parts unless the terms are used with the term "immediately" or "directly".

When an element or layer is disposed "on" other element or layer, another layer or another element may be disposed directly on the other element or interposed therebetween.

Although the terms "first", "second", and the like are used for describing various components, these components are not confined by these terms. These terms are merely used for distinguishing one component from the other components. Therefore, a first component to be mentioned below may be a second component in a technical concept of the present disclosure.

Like reference numerals generally denote like elements throughout the specification.

A size and a thickness of each component illustrated in the drawing are illustrated for the convenience of description, and the present disclosure is not limited to the size and the thickness of the component illustrated.

The features of various embodiments of the present disclosure can be partially or entirely bonded to or combined with each other and can be interlocked and operated in technically various ways, and the embodiments can be carried out independently of or in association with each other.

Hereinafter, the present disclosure will be described in detail with reference to the drawings.

FIG. 1 is a plan view of a display device according to an exemplary embodiment of the present disclosure. For the convenience of description, in FIG. 1, among various components of a display device 100, only a substrate 110, a gate driver GD, a data driver DD, a timing controller TC, clock lines CLK1, CLK2, and CLK3, and a plurality of sub pixels SP are illustrated.

The substrate 110 is a component for supporting various components included in the display device 100 and may be formed of an insulating material. For example, the substrate 110 may be formed of glass or a plastic material such as polyimide.

The substrate 110 includes an active area AA and a non-active area NA.

The active area AA is an area where a plurality of sub pixels SP is disposed to display images. In the active area AA, sub pixels SP including an emission area for displaying images and a driving circuit for driving the sub pixels SP may be disposed.

The non-active area NA is an area where no image is displayed and various wiring lines and driving ICs for driving the sub pixels SP and the driving circuits disposed in the active area AA are disposed. In the non-active area NA, various drivers such as a gate driver GD or a data driver DD may be disposed.

The gate driver GD outputs a gate voltage and an emission control voltage under the control of the timing controller TC. The gate driver GD selects a sub pixel SP in which a data voltage is charged through a wiring line such as a gate line GL or an emission control signal line and adjust an emission timing. The gate driver GD shifts a gate voltage and an emission control voltage using a shift register to sequentially supply the gate voltage and the emission control voltage. The gate driver GD may be directly formed on the substrate 110 as illustrated in FIG. 1 by a gate-driver in panel (GIP) manner, but is not limited thereto.

The timing controller TC receives a timing signal such as a vertical/horizontal synchronization signal Vsync or Hsync, a data enable signal Data Enable, or a dot clock DCLK. The timing controller TC outputs control signals to control an operation timing of the data driver DD and the gate driver GD. In this case, the control signal includes a gate timing control signal and a data timing control signal. Further, the timing controller TC may supply digital video data to the data driver DD.

The data driver DD outputs the digital video data as a data voltage under the control of the timing controller TC to supply the data voltage to the data line DL.

In the meantime, the gate timing control signal which allows the timing controller TC to control the gate driver GD includes a gate start signal and a gate shift clock signal. The gate start signal is a start signal to generate a first gate voltage and the gate shift clock signal is a clock signal to shift the gate start signal.

The plurality of clock lines CLK1, CLK2, and CLK3 may transmit the gate shift clock signal from the timing controller TC to the gate driver GD. The plurality of clock lines CLK1, CLK2, and CLK3 includes a first clock line CLK1, a second clock line CLK2, and a third clock line CLK3. In this case, the first clock line CLK1 to third clock line CLK3 are disposed to be parallel to the gate driver GD. A part of the first clock line CLK1' extending to the gate driver GD may intersect the second clock line CLK2 and the third clock line CLK3 to transmit the gate shift clock signal from the first clock line CLK1 to the gate driver GD.

A part of the second clock line CLK2' extending to the gate driver GD may intersect the third clock line CLK3 to transmit the gate shift clock signal from the second clock line CLK2 to the gate driver GD.

The third clock line CLK3 of the plurality of clock lines CLK1, CLK2, and CLK3 is disposed at an inner side of the substrate 110 more than the first clock line CLK1 and the second clock line CLK2. Therefore, a part of the third clock line CLK3' may not intersect the first clock line CLK1 and the second clock line CLK2 to transmit the gate shift clock signal from the third clock line CLK3 to the gate driver GD.

The plurality of clock lines CLK1, CLK2, and CLK3 may disposed on the same layer. However, the part of the plurality of clock lines CLK1', CLK2', and CLK3' and the plurality of clock lines CLK1, CLK2, and CLK3 are disposed on different layers, but is not limited thereto. In an embodiment of the present disclosure, a first clock line and a second clock line may be included in the display device, wherein the first clock line may be disposed on a different layer from the second clock line, and a part of the first clock line may extend to the gate driver GD of the display device and intersect a part of the second clock line to transmit a gate shift clock signal to the gate driver GD. Further, a gate insulating layer may be formed on the substrate and a planarization layer may be formed on the gate insulating layer (which will be discussed in details later), wherein the gate insulating layer and the planarization layer may be interposed between the intersected parts of the first clock line and the second clock line.

In FIG. 1, for the convenience of description, only the clock lines CLK1, CLK2, and CLK3 are illustrated, but the present disclosure is not limited thereto and other wiring lines may be further disposed.

The plurality of sub pixels SP is disposed on the substrate 110. The plurality of sub pixels SP is a minimum unit which configures the active area AA and each of the plurality of sub pixels SP may include an emission area. In this case, in each of the plurality of sub pixels SP, a display element for emitting light in the emission area may be disposed. For example, the display element may be a liquid crystal display element or an organic light emitting diode, but is not limited thereto. Hereinafter, for the convenience of description, it is assumed that the display element is an organic light emitting diode.

Hereinafter, the sub pixel will be described in more detail with reference to FIGS. 2 and 3.

Figure 2:
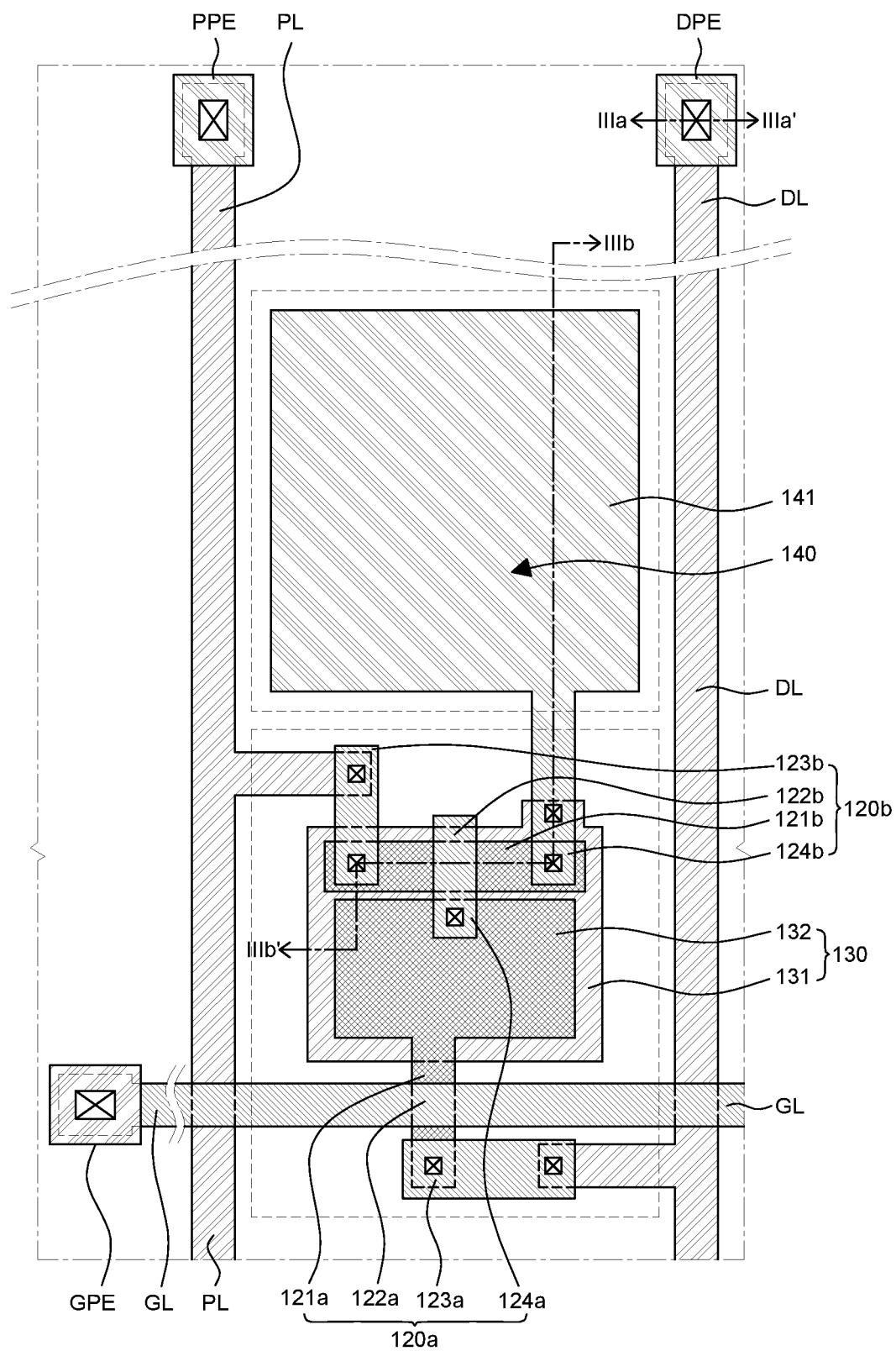
FIG. 2 is an enlarged view of a sub pixel of an active area and a pad electrode of a non-active area.

FIG. 2 is an enlarged view of a sub pixel of an active area and a pad electrode of a non-active area. FIG. 3 is a cross-sectional view taken along the lines IIIa-IIIa' and IIIb-IIIb' of FIG. 2. Referring to FIGS. 2 and 3, a display device 100 according to an exemplary embodiment of the present disclosure includes a substrate 110, a buffer layer 111, a gate insulating layer 112, a planarization layer 113, a passivation layer 114, a bank 115, a first thin film transistor 120a, a second thin film transistor 120b, a capacitor 130, an organic light emitting diode 140, a data line DL, a gate line GL, a power line PL, a data pad electrode DPE, a gate pad electrode GPE, and a power pad electrode PPE.

On the substrate 110, the data line DL, the power line PL, and a first capacitor electrode 131 are disposed.

The data line DL transmits a data voltage from the data driver DD to the sub pixel SP. Specifically, the data line DL transmits the data voltage to a first source electrode 123a of a first thin film transistor 120a of the sub pixel SP. However, it is not limited thereto and the data line DL may transmit the data voltage to a first drain electrode 124a of the first thin film transistor 120a of the sub pixel SP.

The data line DL may extend from the active area AA to the non-active area NA and receive the data voltage from the data driver DD disposed in the non-active area NA. For example, the data line DL may receive the data voltage from the data driver DD through the data pad electrode DPE disposed at one end of the data line DL.

The power line PL transmits the power voltage to the sub pixel SP. Specifically, the power line PL transmits the power voltage to a second source electrode 123b of a second thin film transistor 120b of the sub pixel SP. The power line DL may extend from the active area AA to the non-active area NA and receive the power voltage from the driving IC disposed in the non-active area NA. For example, the power line PL may receive the power voltage from the driving IC through the power pad electrode PPE disposed at one end of the power line PL. The power line PL may be disposed in the active area AA and disposed in parallel with the data line DL. The power pad electrode PPE may be disposed in the non-active area NA and electrically connected to the power line PL, and the power pad electrode PPE may be formed of the same material as a first conductive layer of a gate electrode (which will be discussed in details later).

The first capacitor electrode 131 is included in the capacitor 130 together with a second capacitor electrode 132 which will be described below. The first capacitor electrode 131 may be connected to the second drain electrode 124b of the second thin film transistor 120b. The first capacitor electrode 131 is disposed to overlap the second thin film transistor 120b. However, the first capacitor electrode 131 is not floated and has the same electric potential as the second drain electrode 124b, so that the first capacitor electrode 131 does not affect the driving of the second thin film transistor 120b disposed to overlap the first capacitor electrode 131.

The data line DL, the power line PL, and the first capacitor electrode 131 may be formed of the same material on the same layer. For example, the data line DL, the power line PL, and the first capacitor electrode 131 may be configured by copper (Cu), aluminum (Al), or molybdenum (Mo) which is a conductive material, or an alloy thereof, but is not limited thereto.

The first capacitor electrode 131 may block light which is incident onto a second active layer 121b of the second thin film transistor 120b below the second thin film transistor 120b. Therefore, the first capacitor electrode 131 may serve as a light shielding layer. For example, when light is irradiated onto the second active layer 121b, leakage current is generated to deteriorate a characteristic of the second thin film transistor 120b, which may cause a reliability problem. However, the first capacitor electrode 131 which is formed of a conductive material which is not transparent is disposed to a lower portion of the second thin film transistor 120b, so that the light which is incident onto the second thin film transistor 120b may be blocked by the lower portion of the substrate 110.

The buffer layer 111 is disposed on the data line DL, the power line PL, and the first capacitor electrode 131. The buffer layer 111 may minimize diffusion of moisture or impurities from the substrate 110. The buffer layer 111 may be configured by a single layer or a double layer of silicon oxide (SiOx) or silicon nitride (SiNx), but is not limited thereto.

On the buffer layer 111, a first active layer 121a of the first thin film transistor 120a and a second active layer 121b of the second thin film transistor 120b are disposed. The first active layer 121a and the second active layer 121b are spaced apart from each other. The second active layer 121b is disposed to entirely overlap the first capacitor electrode 131. The first active layer 121a is disposed to partially overlap the first capacitor electrode 131.

In this case, a partial area of the first active layer 121a which overlaps the first capacitor electrode 131 may also serve as a second capacitor electrode 132 of the capacitor 130.

Specifically, the first capacitor electrode 131 and the second capacitor electrode 132 overlap each other to form the capacitor 130. The capacitor 130 stores the data voltage to maintain the organic light emitting diode 140 in the same state until a next gate voltage is applied to the gate line GL.

In the meantime, the first active layer 121a may be formed integrally with the second capacitor electrode 132. Therefore, a part of the first active layer 121a may become the second capacitor electrode 132. That is, a part of the second capacitor electrode 132 may become the first active layer 121a.

In this case, the first active layer 121a and the second capacitor electrode 132 may be formed of the same material. However, provided that the first active layer 121a has a property as a semiconductor, the first active layer 121a may serve as the first active layer 121a of the first thin film transistor 120a. Further, provided that the second capacitor electrode 132 has a conductive property, the second capacitor electrode 132 may serve as an electrode of the capacitor 130.

Therefore, a conducting process may be performed on a part of the first active layer 121a. A conducted part of the first active layer 121a may become the second capacitor electrode 132. Therefore, the conducted part of the first active layer 121a which overlaps the first capacitor electrode 131 and is conducted may become the second capacitor electrode 132. The remaining part of the first active layer 121a which does not overlap the first capacitor electrode 131 and is not conducted may serve as the first active layer 121a of the first thin film transistor 120a.

In the meantime, the partial area 121b" of the second active layer 121b may also be conducted. Specifically, a partial area 121b" of the second active layer 121b which does not overlap a gate insulating layer 112 which will be described below may be conducted. In contrast, the other partial area 121b' of the second active layer 121b which overlaps the gate insulating layer 112 may have a property as a semiconductor.

In the meantime, the first active layer 121a and the second active layer 121b may be formed of amorphous silicon, polycrystalline silicon, an oxide semiconductor, or an organic semiconductor, but is not limited thereto.

The gate insulating layer 112 is disposed on the first active layer 121a and the second active layer 121b. The gate insulating layer 112 insulates the first active layer 121a from the first gate electrode 122a. Also, the gate insulating layer 112 insulates the second active layer 121b from the second gate electrode 122b. The gate insulating layer 112 may be formed of an insulating material. For example, the gate insulating layer 112 may be configured by a single layer or a double layer of silicon oxide (SiOx) or silicon nitride (SiNx), but is not limited thereto.

In the meantime, the display device 100 may be implemented as a top emission type organic light emitting display device or a bottom emission type organic light emitting display device. According to the top emission type, light emitted from the organic light emitting diode 140 is discharged above the organic light emitting diode 140 so that images are implemented above the substrate 110. According to the bottom emission type, light emitted from the organic light emitting diode 140 is discharged below the organic light emitting diode 140 so that images are implemented below the substrate 110. Hereinafter, it is described that the display device 100 is the bottom emission type organic light emitting display device, but is not limited thereto.

A color filter 150 is disposed on the gate insulating layer 112. The color filter 150 may convert light emitted from the organic light emitting diode 140 into various color light. The color filter 150 is disposed to overlap one organic light emitting diode 140 on the gate insulating layer 112. The color filter 150 may include a red color filter, a green color filter, and a blue color filter. However, the color filter 150 may be omitted depending on the color of light emitted from the organic light emitting diode 140. That is, when the organic light emitting diode 140 emits red light, green light, and blue light, a separate color filter 150 may not be necessary.

The planarization layer 113 is disposed on the color filter 150. The planarization layer 113 may planarize an upper portion of a partial area of the substrate 110. Specifically, the planarization layer 113 is not disposed in an area overlapping the first thin film transistor 120a, the second thin film transistor 120b, and the capacitor 130. The planarization layer 113 may be disposed in an area overlapping the organic light emitting diode 140, the gate line GL, the data line DL, and the power line PL. Further, in some exemplary embodiments, the planarization layer 113 may not be disposed in all or a part of the non-active area NA. That is, the planarization layer 113 may planarize only the upper portions of the data line DL, the power line PL, and the color filter 150.

The planarization layer 113 may be configured by a single layer or a double layer and may be formed of an organic material. For example, the planarization layer 113 may be formed of an acrylic organic material, but is not limited thereto.

The gate line GL is disposed on the planarization layer 113 and the gate insulating layer 112. The gate line GL transmits the gate voltage to the sub pixel SP. Specifically, the gate line GL transmits the gate voltage to the first gate electrode 122a of the first thin film transistor 120a. The gate line GL may extend from the active area AA to the non-active area NA. The gate line GL may receive the gate voltage from the gate driver GD disposed in the non-active area NA. For example, the gate line GL may receive the gate voltage from the gate driver GD through the gate pad electrode GPE disposed at one end of the gate line GL. The gate pad electrode GPE may be disposed in the non-active area NA and electrically connected to the gate line GL, and the gate pad electrode GPE may be formed of the same material as a first conductive layer of a gate electrode (which will be discussed in details later).

The first gate electrode 122a, the first source electrode 123a, and the first drain electrode 124a are disposed on the first active layer 121a. The first gate electrode 122a, the first source electrode 123a, and the first drain electrode 124a are disposed on the same layer as the gate line GL to be formed of the same material as the gate line GL. In this case, the first gate electrode 122a may be insulated from the first active layer 121a by the gate insulating layer 112.

The first gate electrode 122a may be formed integrally with the gate line GL. When the gate voltage is applied to the first gate electrode 122a from the gate line GL, the first thin film transistor 120a may be turned on.

The first source electrode 123a may be applied with the data voltage from the data line DL disposed below the first active layer 121a. The first source electrode 123a is electrically connected to the first active layer 121a to transmit the data voltage to the first active layer 121a.

The first drain electrode 124a is electrically connected to the first active layer 121a to transmit a voltage applied from the first active layer 121a to the second gate electrode 122b of the second thin film transistor 120b.

The second gate electrode 122b, the second source electrode 123b, and the second drain electrode 124b of the second thin film transistor 120b are disposed on the second active layer 121b. The second gate electrode 122b may be insulated from the second active layer 121b by the gate insulating layer 112.

The second source electrode 123b and the second drain electrode 124b are in contact with a partial area of the second active layer 121b which is exposed from the gate insulating layer 112 to be electrically connected to the second active layer 121b. In this case, as described above, the partial area 121b" of the second active layer 121b which is in contact with the second source electrode 123b and the second drain electrode 124b does not overlap the gate insulating layer 112 and may be conducted. In contrast, the other partial area 121b' of the second active layer 121b which overlaps the gate insulating layer 112 and the second gate electrode 122b is not conducted and has a property as a semiconductor.

The second source electrode 123b is electrically connected to the power line PL to be applied with the power voltage. The second drain electrode 124b is electrically connected to the organic light emitting diode 140 to transmit the power voltage applied to the second source electrode 123b to the organic light emitting diode 140.

For example, when the gate voltage is applied from the gate line GL, the first thin film transistor 120a transmits the data voltage to the second thin film transistor 120b to turn on the second thin film transistor 120b. When the second thin film transistor 120b is turned on, the second thin film transistor 120b supplies the power voltage of the power line PL to the organic light emitting diode 140 to drive the organic light emitting diode 140.

In the meantime, the gate line GL, the first gate electrode 122a, the first source electrode 123a, and the first drain electrode 124a of the first thin film transistor 120a and the second gate electrode 122b, the second source electrode 123b, and the second drain electrode 124b of the second thin film transistor 120b may be configured by a double layer of a first conductive material and a second conductive material.

Figure 3:
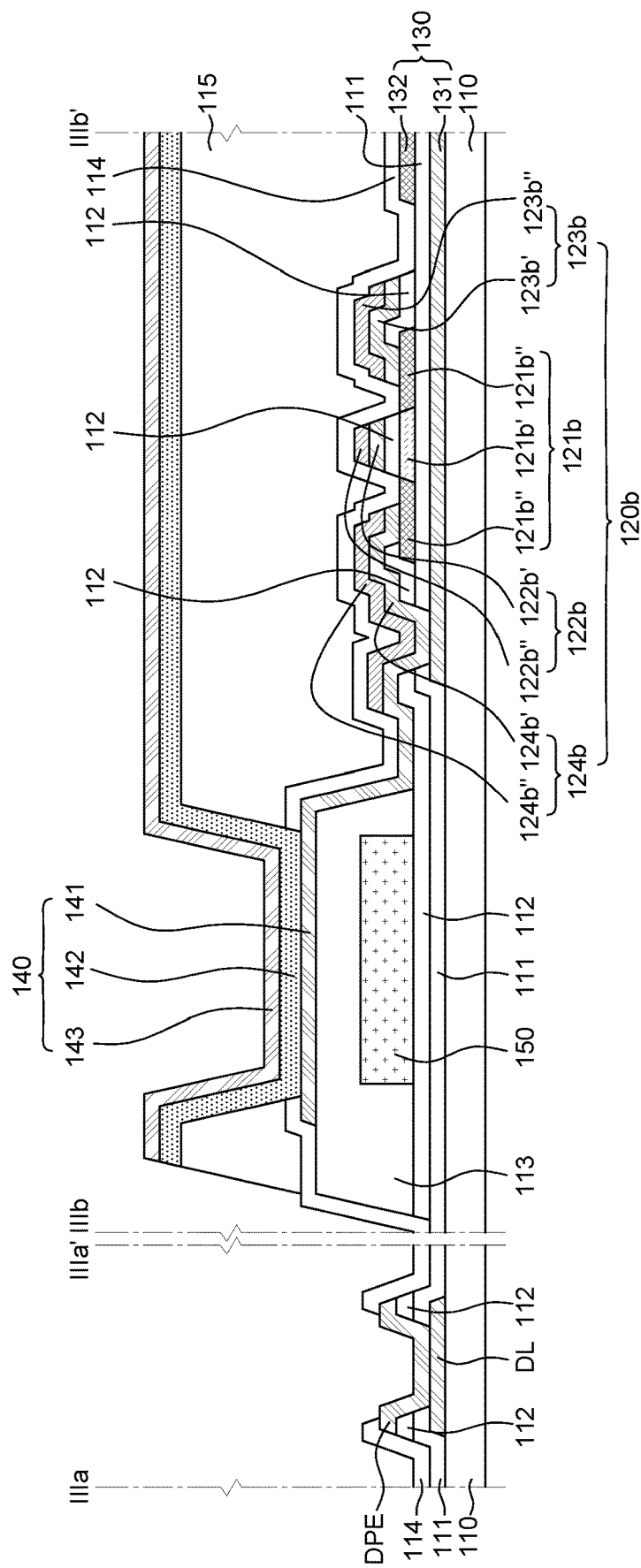
FIG. 3 is a cross-sectional view taken along the lines and IIIb-IIIb' of FIG. 2.

For example, referring to FIG. 3, the second gate electrode 122b of the second thin film transistor 120b may be configured by a double layer of a first conductive layer 122b' formed of a first conductive material and a second conductive layer 122b'' formed of a second conductive material on the first conductive layer 122b'. Next, the second source electrode 123b may be configured by a double layer of a first conductive layer 123b' formed of a first conductive material and a second conductive layer 123b'' formed of a second conductive material on the first conductive layer 123b'. The second drain electrode 124b may be configured by a double layer of a first conductive layer 124b' formed of a first conductive material and a second conductive layer 124b'' formed of a second conductive material on the first conductive layer 124b'.

Here, the first conductive material may be a transparent conductive material. For example, the first conductive material may be formed of tin oxide (TO), indium tin oxide (ITO), indium zinc oxide (IZO), or indium zinc tin oxide (ITZO), but is not limited thereto.

The second conductive material may be a metallic material. For example, the second conductive material may be configured by copper (Cu), aluminum (Al), molybdenum (Mo), or an alloy thereof, but is not limited thereto.

The anode 141 of the organic light emitting diode 140 is disposed on the planarization layer 113. The anode 141 may supply holes to the organic light emitting layer 142 of the organic light emitting diode 140 which will be described below. The anode 141 may be formed of a conductive material having a high work function. For example, the anode may be formed of tin oxide (TO), indium tin oxide (ITO), indium zinc oxide (IZO), or indium zinc tin oxide (ITZO), but is not limited thereto.

The anode 141 may be electrically connected to the second drain electrode 124b of the second thin film transistor 120b, but is not limited thereto. The anode 141 may be connected to the second source electrode 123b or the second drain electrode 124b, depending on the type of the second thin film transistor 120b.

The second thin film transistor 120b may be implemented as an N type or a P type. For example, the second thin film transistor 120b is a three-electrode element including a second gate electrode 122b, the second source electrode 123b, and the second drain electrode 124b. The second source electrode 123b supplies carriers to the second thin film transistor 120b. The second drain electrode 124b is an electrode through which the carriers move to the outside from the second thin film transistor 120b. Therefore, the carriers may flow from the second source electrode 123b to the second drain electrode 124b.

If the second thin film transistor 120b is an N type, the carrier is an electron. Therefore, the electron flows from the second source electrode 123b to the second drain electrode 124b so that current may flow from the second drain electrode 124b to the second source electrode 123b. If the second thin film transistor 120b is a P type, the carrier is a hole. Therefore, the hole flows from the second source electrode 123b to the second drain electrode 124b so that current may flow from the second source electrode 123b to the second drain electrode 124b. Therefore, depending on the type of the second thin film transistor 120b, the anode 141 may be connected to the second source electrode 123b or the second drain electrode 124b. Hereinafter, for the convenience of description, it is assumed that the second thin film transistor 120b is an N type and the second drain electrode 124b is connected to the anode 141.

In the meantime, the anode 141 may be formed of the same material as the first conductive layer 124b' of the second drain electrode 124b. Specifically, the anode 141 may be formed by extending the first conductive layer 124b' of the second drain electrode 124b to an upper surface of the planarization layer 113. Therefore, the anode 141 and the second drain electrode 124b of the second thin film transistor 120b are integrally formed so as to be electrically connected without having a separate contact hole.

The passivation layer 114 is disposed on the first thin film transistor 120a, the second thin film transistor 120b, the capacitor 130, the anode 141, and the gate line GL. The passivation layer 114 is an insulating layer for protecting components below the passivation layer 114. In this case, the passivation layer 114 may be disposed on the anode 141 to open a part of the anode 141. Therefore, a lower surface of the passivation layer 114 may be in contact with the first thin film transistor 120a, the second thin film transistor 120b, the second capacitor electrode 132 of the capacitor 130, and at least parts of the anode 141. The passivation layer 114 may be formed of the same material as the gate insulating layer 112 and for example, may be configured by a single layer or a double layer of silicon oxide (SiOx) or silicon nitride (SiNx), but is not limited thereto.

A bank 115 is disposed on the passivation layer 114. The bank 115 is an insulating layer which divides adjacent sub pixels SP. The bank 115 may be disposed to open a part of the anode 141. The bank 115 may be an organic insulating material which is disposed to cover an edge of the anode 141.

The organic light emitting layer 142 of the organic light emitting diode 140 is disposed on a partial area of the anode 141 which is open from the passivation layer 114 and the bank 115. The organic light emitting layer 142 is supplied with the holes from the anode 141 and supplied with electrons from a cathode 143 to emit light. The organic light emitting layer 142 may be an organic light emitting layer 142 which emits white light, but is not limited thereto. Therefore, the organic light emitting layer 142 may emit different color light such as green light, blue light, or red light.

The cathode 143 of the organic light emitting diode 140 is disposed on the organic light emitting layer 142. The cathode 143 may supply electrons to the organic light emitting layer 142. The cathode 143 may be formed of a conductive material having a low work function. For example, the cathode 143 may be formed of any one or more selected from the group consisting of metals such as magnesium (Mg), silver (Ag), aluminum (Al), and calcium (Ca) and an alloy thereof, but is not limited thereto.

The organic light emitting diode 140 may include a single layer of the organic light emitting layer 142 or may have a tandem structure in which a plurality of organic light emitting layers 142 are stacked, but are not limited thereto.

The display device 100 according to an exemplary embodiment of the present disclosure may simplify the structure by integrally forming the anode 141 and the second drain electrode 124b without forming a separate contact hole to electrically connect the anode 141 and the second drain electrode 124b. Specifically, the second gate electrode 122b, the second source electrode 123b, and the second drain electrode 124b are disposed on the same layer. The second gate electrode 122b, the second source electrode 123b, and the second drain electrode 124b may be formed of a double layer of the first conductive material and the second conductive material. The anode 141 of the organic light emitting diode 140 is electrically connected to the second drain electrode 124b to drive the organic light emitting diode 140. In this case, the anode 141 may be formed of the same material as the first conductive layer 124b' of the second drain electrode 124b which is formed of the first conductive material. Therefore, the first conductive layer 124b' of the second drain electrode 124b extends to the upper surface of the planarization layer 113 to dispose the anode 141. The anode 141 is formed of the same material as the first conductive layer 124b' of the second drain electrode 124b. The first conductive layer 124b' electrically connects the anode 141 and the second drain electrode 124b.

Further, the planarization layer 113 is disposed in a remaining area excluding an area overlapping the first thin film transistor 120a, the second thin film transistor 120b, and the capacitor 130. For example, the planarization layer 113 may be disposed to overlap the data line DL, the gate line GL, the power line PL, and the organic light emitting diode 140. In this case, the power line PL and the data line DL are disposed below the planarization layer 113 and the gate line GL is disposed on the planarization layer 113. That is, the power line PL, the data line DL, and the gate line GL are disposed on different layers. The planarization layer 113 is disposed between the power line PL and the gate line GL. The planarization layer 113 is disposed between the data line DL and the gate line GL. In this case, a parasitic capacitance may be generated due to the overlapping of the wiring lines at the intersection of the power line PL and the data line DL and the gate line GL. The parasitic capacitance delays the voltage which is transmitted to the respective wiring lines to affect the driving of the display device 100. However, since the planarization layer 113 is disposed at the intersection of the power line PL and the data line DL and the gate line GL, a distance spaced between the wiring lines is increased to reduce the parasitic capacitance. Further, as the distance spaced between the wiring lines is increased, the short circuit between the power line PL and the data line DL and the gate line GL may be minimized.

Hereinafter, a display device 100 and a manufacturing method of a display device 100 according to an exemplary embodiment of the present disclosure will be described in detail with reference to FIGS. 4A to 4G.

Figure 4A:
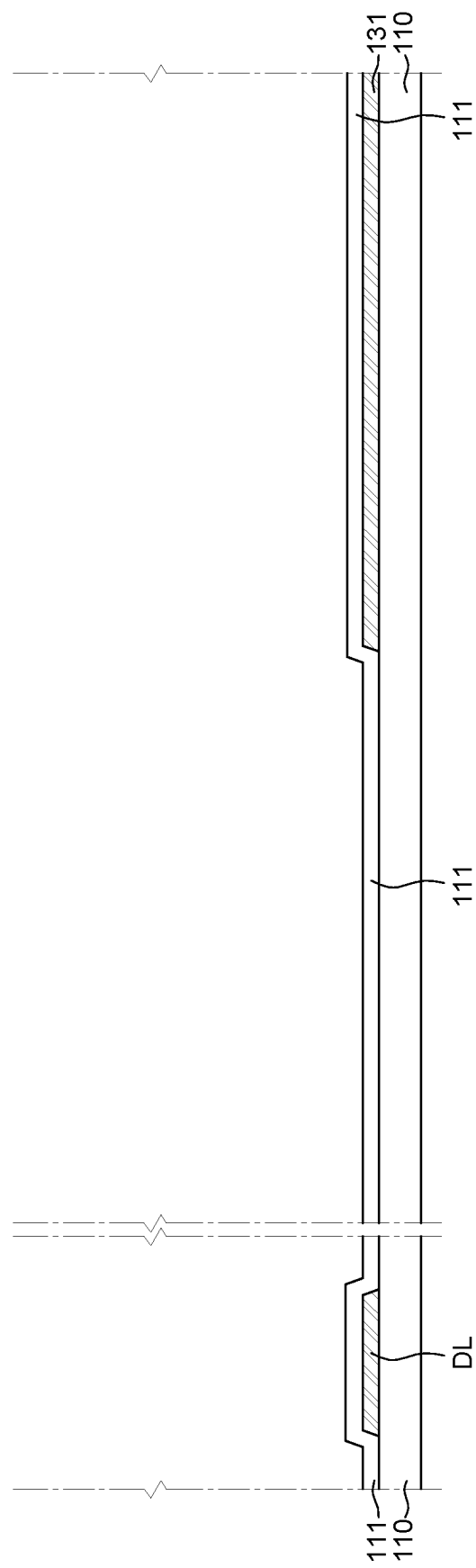
FIGS. 4A to 4G are schematic views of processes for explaining a display device and a manufacturing method of a display device according to an exemplary embodiment of the present disclosure.
Figure 4B:
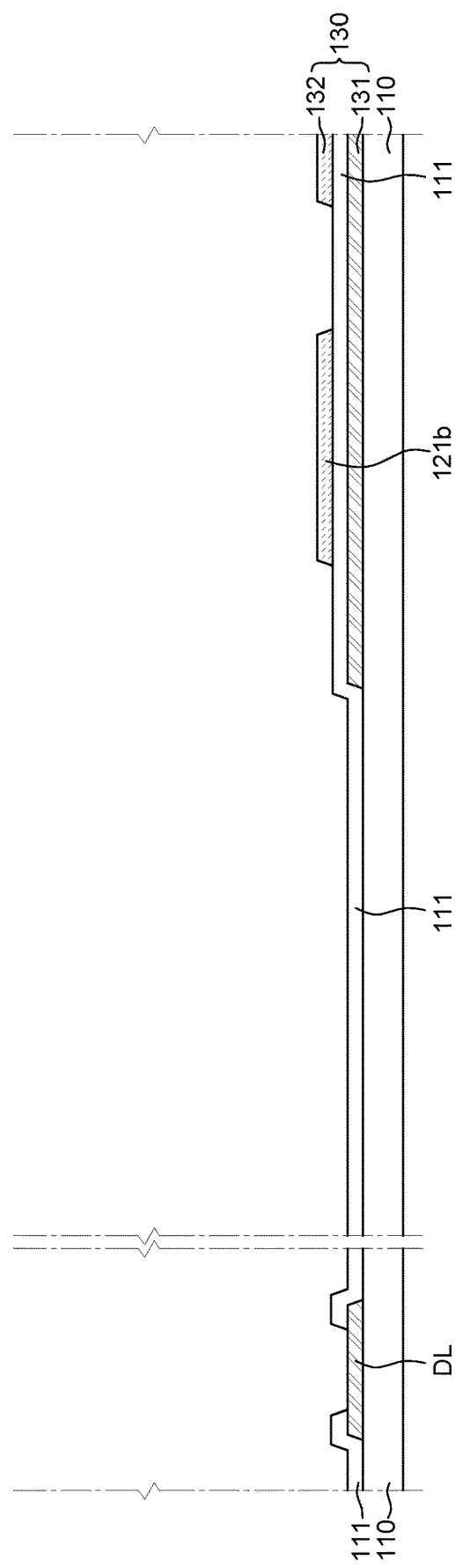
Figure 4C:
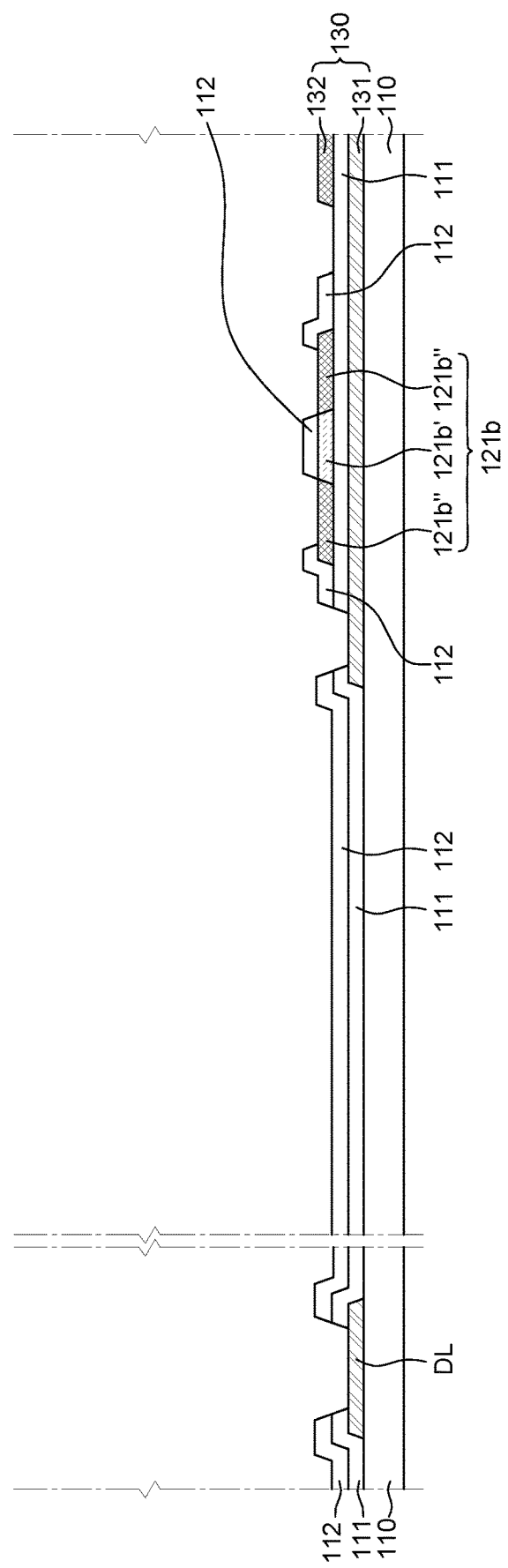
Figure 4D:
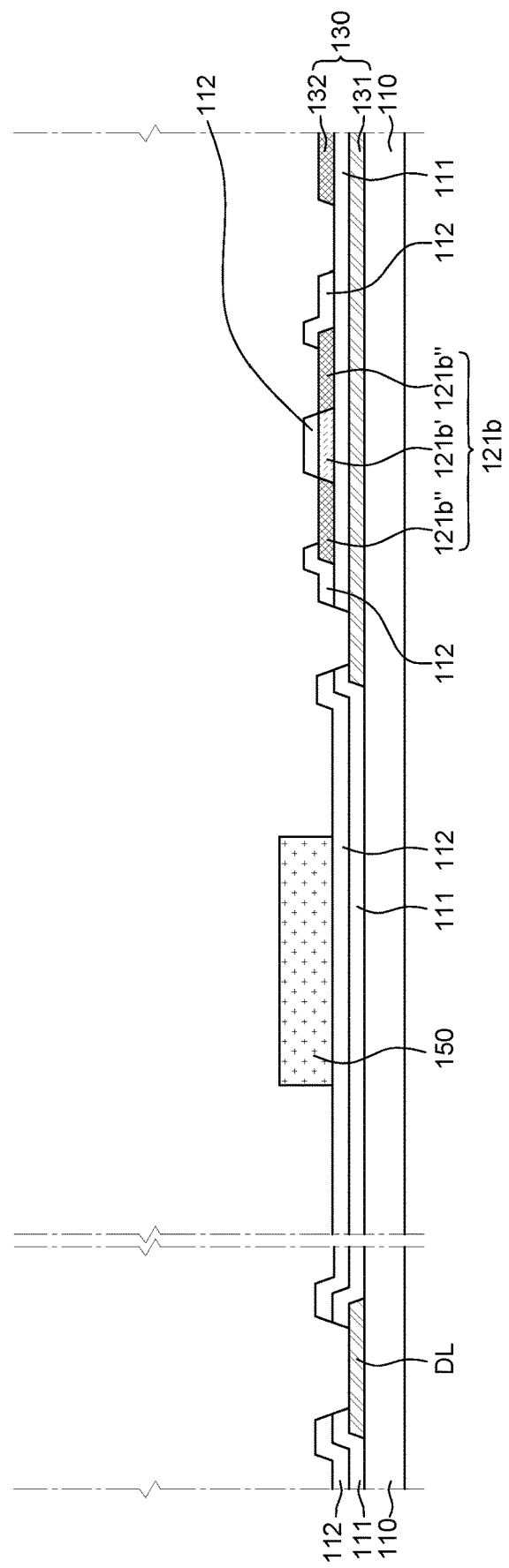
Figure 4E:
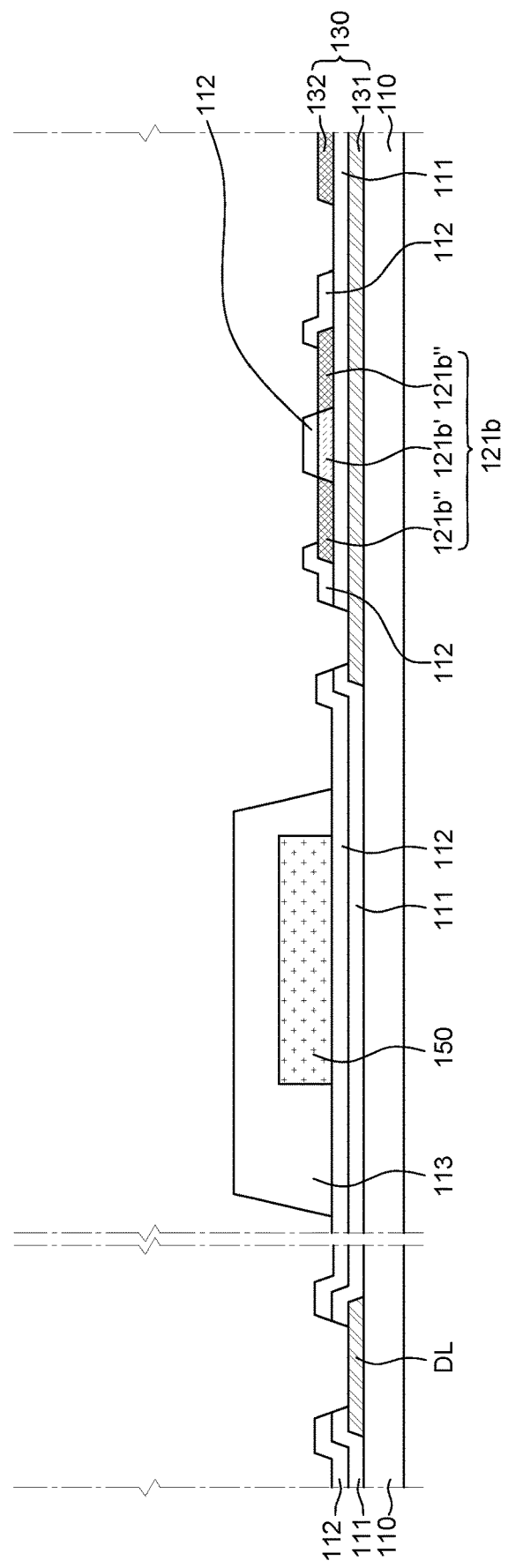
Figure 4F:
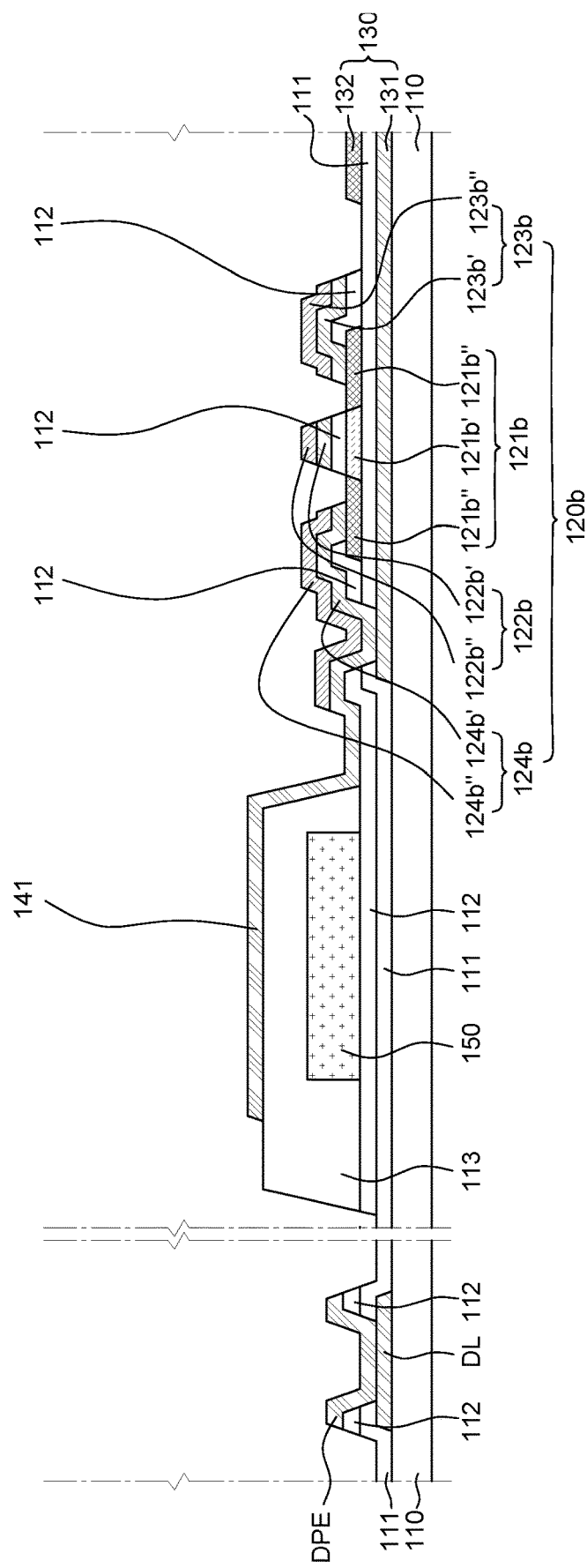
Figure 4G:
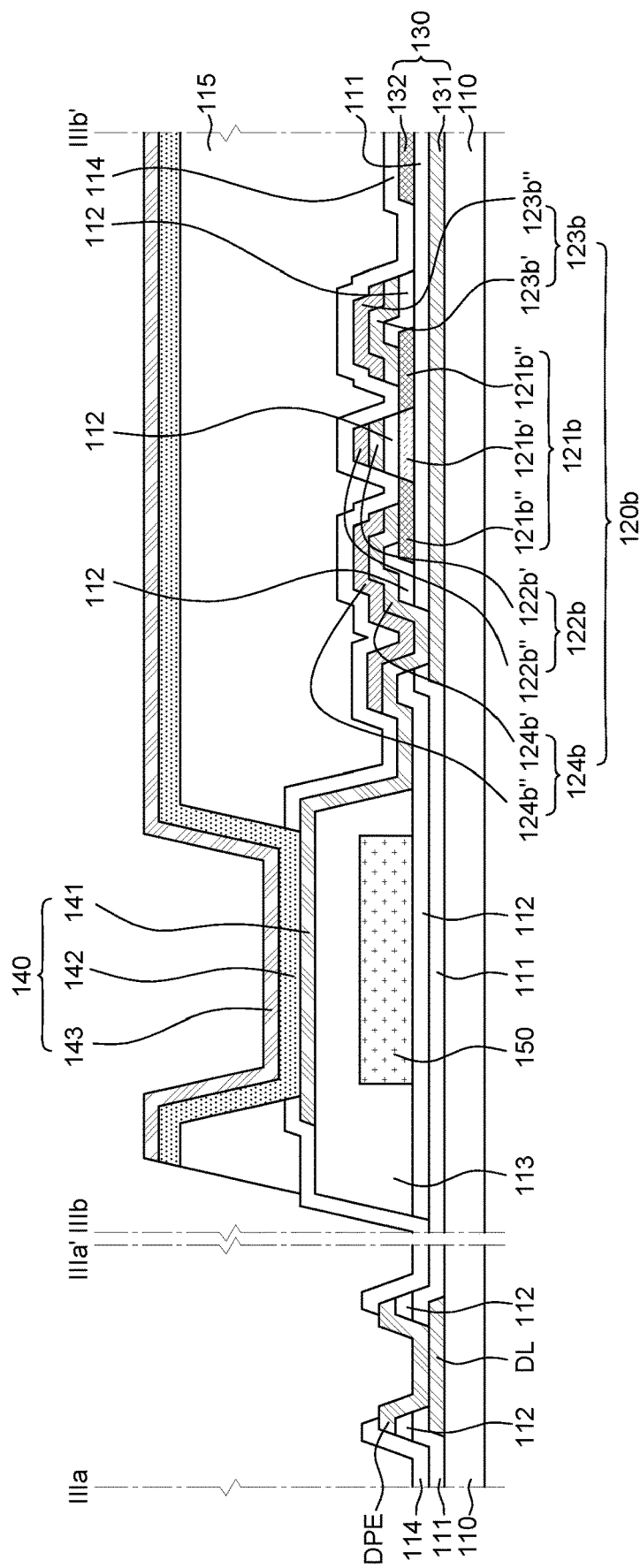

FIGS. 4A to 4G are schematic views of processes for explaining a display device and a manufacturing method of a display device according to an exemplary embodiment of the present disclosure. Specifically, a display device of FIGS. 4A to 4G is schematic views of processes for explaining a display device of FIGS. 1 to 3 and a manufacturing method of the display device. FIG. 4A is a cross-sectional view of a display device in which a first mask process is completed. FIG. 4B is a cross-sectional view of a display device in which a second mask process is completed. FIG. 4C is a cross-sectional view of a display device in which a third mask process is completed. FIG. 4D is a cross-sectional view of a display device in which fourth to sixth mask processes are completed. FIG. 4E is a cross-sectional view of a display device in which a seventh mask process is completed. FIG. 4F is a cross-sectional view of a display device in which an eighth mask process is completed. FIG. 4G is a cross-sectional view of a display device in which a ninth mask process is completed.

Referring to FIG. 4A, a first capacitor electrode 131 and a data line DL are simultaneously formed on a substrate 110 through the first mask process.

Specifically, a conductive material is formed on the substrate 110. Next, during the first mask process, the conductive material is etched to form the first capacitor electrode 131 and the data line DL.

Next, a buffer layer 111 may be formed on the substrate 110 to protect the first capacitor electrode 131 and the data line DL.

Referring to FIG. 4B, the second active layer 121b and the second capacitor electrode 132 are formed on the buffer layer 111 through the second mask process.

Specifically, a material for forming the second active layer 121b, for example, a semiconductor material is formed on the buffer layer 111. Next, the material for forming the second active layer 121b is etched through the second mask process to form the second active layer 121b and the second capacitor electrode 132.

However, the second capacitor electrode 132 needs to be subject a conducting process later to serve as the second capacitor electrode 132, which will be described with reference to FIG. 4C.

Referring to FIG. 4C, the gate insulating layer 112 may be formed on the second active layer 121b through the third mask process.

Specifically, the gate insulating material may be formed on the second active layer 121b. Next, a contact hole is formed on the gate insulating material through the third mask process to form the gate insulating layer 112.

An area where the contact hole is formed on the gate insulating material will be specifically described. First, the gate insulating material is etched in an area overlapping one end of the data line DL to form the contact hole. For example, in order to form a contact hole through which the data line DL is connected to the data pad electrode DPE, the buffer layer 111 and the gate insulating material which cover one end of the data line DL may be partially etched.

Simultaneously, in order to form the contact hole through which the first capacitor electrode 131 and the second drain electrode 124b are electrically connected, the buffer layer 111 and the gate insulating material which cover the first capacitor electrode 131 may be partially etched.

For the conducting process which will be described below, the gate insulating material which covers the second capacitor electrode 132 may be etched.

Finally, in order to form a contact hole through which the second active layer 121b is connected to the second source electrode 123b and the second drain electrode 124b, the gate insulating material may be etched to expose a part of an upper surface of the second active layer 121b. Specifically, a gate insulating material remains in a central area of the upper surface of the second active layer 121b to insulate the second gate electrode 122b from the second active layer 121b. The gate insulating material is etched in an area adjacent to both ends of the upper surface of the second active layer 121b.

Therefore, the gate insulating material is etched and the buffer layer 111 is also partially etched through the third mask process to form the contact hole through which the data line DL and the first capacitor electrode 131 are in contact with other components. The gate insulating material is etched to expose a part of the upper surface of the second active layer 121b and the second capacitor electrode 132 is also outwardly exposed.

In the meantime, the mask used for the third mask process may be a halftone mask. Specifically, during the third mask process, not only the gate insulating material is etched, but also the buffer layer 111 below the gate insulating material is also etched to form the contact hole in a partial area. Accordingly, without separately using a mask for forming the gate insulating layer 112 and a mask for forming a contact hole on the buffer layer 111, a halftone mask is used to simultaneously form the gate insulating layer 112 and the contact hole of the buffer layer 111.

In the meantime, when the third mask process which etches the gate insulating material and a part of the buffer layer 111 is completed, the partial area 121b'' of the second active layer 121b and the second capacitor electrode 132 which are not covered by the gate insulating layer 112 may be conducted. The second capacitor electrode 132 may serve as the capacitor 130 together with the first capacitor electrode 131 through the conducting process. Only the area 121b'' of the second active layer 121b which is in contact with the second source electrode 123b and the second drain electrode 124b is conducted. In contrast, the semiconductor property of the active layer may be maintained in the area 121b' which overlaps the second gate electrode 122b and is covered by the gate insulating layer 112.

Referring to FIG. 4D, the color filter 150 may be formed through the fourth to sixth mask processes. The color filter 150 may be disposed to overlap the organic light emitting diode 140. A color filter 150 with one color may be formed by one mask process. Therefore, when color filters 150 with several colors are used in the display device 100, the mask process is also added.

For example, the display device 100 according to an exemplary embodiment of the present disclosure uses a red color filter, a green color filter, and a blue color filter. The red color filter may be formed to overlap some of a plurality of organic light emitting diodes 140 through the fourth mask process.

Next, the green color filter may be formed to overlap the other organic light emitting diodes 140 among the plurality of organic light emitting diodes 140 through the fifth mask process.

Finally, the blue color filter may be formed to overlap other organic light emitting diodes 140 among the plurality of organic light emitting diodes 140 through the sixth mask process. However, the number of mask processes may vary depending on the number of colors of the color filter 150, but is not limited thereto.

Referring to FIG. 4E, the planarization layer 113 may be formed through the seventh mask process.

Specifically, a planarization material is formed on the gate insulating layer 112 on which the color filter 150 is formed. Next, the planarization material is etched in an area overlapping the non-active area NA, the first thin film transistor 120a, the second thin film transistor 120b, and the capacitor 130 through the seventh mask process to form the planarization layer 113. Therefore, the planarization layer 113 may planarize an upper portion of the substrate 110 in an area overlapping the organic light emitting diode 140, the gate line GL, the data line DL, and the power line PL.

Referring to FIG. 4F, the second gate electrode 122b, the second source electrode 123b, and the second drain electrode 124b of the second thin film transistor 120b and the data pad electrode DPE may be formed through the eighth mask process.

Specifically, the first conductive material and the second conductive material are sequentially formed on the planarization layer 113 and the gate insulating layer 112. In this case, the first conductive material is formed to fill the contact hole which exposes the data line DL and the first capacitor electrode 131 formed during the third mask process and a partial area of the upper surface of the second active layer 121b which is exposed without being covered by the gate insulating layer 112. Therefore, the data line DL, the first capacitor electrode 131, and the second active layer 121b are in contact with the first conductive material.

Next, during the eighth mask process, the second gate electrode 122b, the second source electrode 123b, and the second drain electrode 124b, and the data pad electrode DPE are formed by etching both the first conductive material and the second conductive material in some area or selectively etching only the second conductive material while remaining the first conductive material in the other area.

First, the second conductive material which is formed above the first conductive material is etched. For example, all the second conductive material formed in the non-active area NA may be etched. Simultaneously, in the active area AA, the second conductive material remains only in the area overlapping the second gate electrode 122b, the second source electrode 123b, and the second drain electrode 124. The second conductive material is etched in the remaining area. Therefore, the second conductive layer 122b'' of the second gate electrode 122b, the second conductive layer 123b'' of the second source electrode 123b, and the second conductive layer 124b'' of the second drain electrode 124b which are formed of the second conductive material are formed.

Next, the first conductive material may be etched sequentially after etching the second conductive material. For example, in the non-active area NA, the first conductive material may be etched in an area excluding the area overlapping the contact hole which exposes one end of the data line DL. Simultaneously, in the active area AA, the first conductive material may be etched in an area excluding the area overlapping the planarization layer 113, the second gate electrode 122b, the second source electrode 123b, and the second drain electrode 124b. Therefore, the data pad electrode DPE, the anode 141, the first conductive layer 122b' of the second gate electrode 122b, the first conductive layer 123b' of the second source electrode 123b, and the first conductive layer 124b' of the second drain electrode 124b which are formed of the first conductive material are formed.

Referring to FIGS. 4F and 2, the gate pad electrode GPE also may be formed through the eighth mask process. First, in the non-active area NA, all the second conductive material may be etched. Next, the first conductive material may be etched in an area excluding the area overlapping one end of the gate line GL. Therefore, the gate pad electrode GPE which is formed of the first conductive material is formed at one end of the gate line GL.

Furthermore, the power pad electrode PPE may be formed through the eighth mask process. First, all the second conductive material formed in the non-active area NA may be etched. Next, the first conductive material may be etched in an area excluding the area overlapping the contact hole which exposes one end of the power line PL. Therefore, the power pad electrode PPE which is formed of the first conductive material is formed at one end of the power line PL.

In summary, the data pad electrode DPE which is electrically connected to one end of the data line DL and the anode 141 disposed on the upper surface of the planarization layer 113 may be formed as a single layer formed of the first conductive material.

The second gate electrode 122b, the second source electrode 123b, and the second drain electrode 124b are formed as a double layer of the first conductive material and the second conductive material.

The anode 141 may be electrically connected to the second drain electrode 124b of the second thin film transistor 120b. In order to connect the anode 141 and the second drain electrode 124b, the first conductive layer 124b' of the second drain electrode 124b and the anode 141 may be integrally formed. That is, the anode 141 may be formed of the same material as the first conductive layer 124b' of the second drain electrode 124b.

When the first conductive material and the second conductive material are etched to form the second drain electrode 124b, the first conductive layer 124b' of the second drain electrode 124b and the anode 141 formed of the first conductive material may be integrally formed. The second conductive material may be etched only in the anode 141 while remaining the second conductive material in the second drain electrode 124b. In this case, the anode 141 needs to be only formed of the first conductive material which is a transparent conductive material for achieving a bottom emission type, so that the second conductive material may be etched in the area overlapping the anode 141. Therefore, the anode 141 only formed of the first conductive material and the second drain electrode 124b formed of the first conductive layer 124b' and the second conductive layer 124b" may be simultaneously formed.

The mask used for the eighth mask process may also be a halftone mask. Specifically, during the eighth mask process, only the second conductive material is etched and the first conductive material is also selectively etched. Therefore, a mask for forming the second conductive layer 122b" of the second gate electrode 122b, the second conductive layer 123b" of the second source electrode 123b, and the second conductive layer 124b" of the second drain electrode 124b by etching the second conductive material and a mask for forming the anode 141 and the data pad electrode DPE by etching the first conductive material are not separately used. Instead, a halftone mask is used to combine two masks.

Referring to FIG. 4G, the passivation layer 114 and the bank 115 are formed through the ninth mask process.

Specifically, a passivation material and a bank material are sequentially formed on the second thin film transistor 120b, the capacitor 130, the anode 141, and the non-active area NA. Next, during the ninth mask process, both the passivation material and the bank material are etched in some area or only the bank material is selectively etched while remaining the passivation material in the other area to form the passivation layer 114 and the bank 115.

First, the bank material formed on the passivation material is etched. For example, the bank material formed in the non-active area NA is etched. In the active area AA, the bank material is etched in the area overlapping the upper surface of the anode 141 so that the organic light emitting layer 142 and the upper surface of the anode 141 are in contact with each other. By doing this, the bank 115 is formed.

In this case, the bank 115 planarizes an area where the planarization layer 113 is not formed, for example, upper portions of the second thin film transistor 120b and the capacitor 130. Further, the bank 115 is disposed at the boundary between the plurality of sub pixels SP to define the sub pixel SP and reduce the color mixture.

Next, after etching the bank material to form the bank 115, the passivation material is etched. For example, the passivation material is etched in the area overlapping the upper surface of the anode 141 so that the organic light emitting layer 142 and the upper surface of the anode 141 are in contact with each other. The passivation material is etched in the area which is in contact with the data pad electrode DPE. Thereby, the passivation layer 114 is formed.

The mask used for the ninth mask process may be a halftone mask. Specifically, during the ninth mask process, the bank material is etched only in the area overlapping the anode 141 and the non-active area NA. The passivation material is also selectively etched in the area overlapping the anode 141 and the area overlapping the data pad electrode DPE. Therefore, the halftone mask is used to combine two masks without separately using a mask for forming the bank 115 and a mask for forming the passivation layer 114.

In the manufacturing method of display device according to the exemplary embodiment of the present disclosure, the second gate electrode 122b, the second source electrode 123b, and the second drain electrode 124b of the second thin film transistor 120b and the anode 141 are simultaneously formed by the same material, so that the structure and the process of the sub pixel SP may be simplified. Specifically, the second active layer 121b is formed on the substrate 110 and the gate insulating layer 112 and the planarization layer 113 are sequentially formed on the second active layer 121b. In this case, in the case of the bottom emission type display device 100, the color filter 150 is formed on the gate insulating layer 112 and then the planarization layer 113 may be formed. Next, the first conductive material and the second conductive material are formed on the gate insulating layer 112 and the planarization layer 113. Next, the first conductive material and the second conductive material are selectively etched using the halftone mask to simultaneously form the second gate electrode 122b, the second source electrode 123b, the second drain electrode 124b, and the anode 141. In this case, the anode 141 and the second drain electrode 124b are integrally formed without forming a separate contact hole to electrically connect the anode 141 and the second drain electrode 124b to simplify the structure. Therefore, the components are not formed by separate mask processes but formed by one mask process so that the number of mask processes is reduced and the structure is simplified to reduce the manufacturing cost and time.

Further, the passivation layer 114 and the bank 115 are simultaneously formed so that the process may be simplified. Specifically, the passivation material and the bank material are sequentially formed on the substrate 110. Next, the passivation material and the bank material are etched using the halftone mask in the area overlapping the anode 141. In the non-active area NA, the entire bank material is etched and the passivation material is etched to expose the data pad electrode DPE. Therefore, the passivation layer 114 and the bank 115 are simultaneously formed using one mask process to reduce the number of mask processes and reduce the manufacturing cost and time.

Figure 5A:
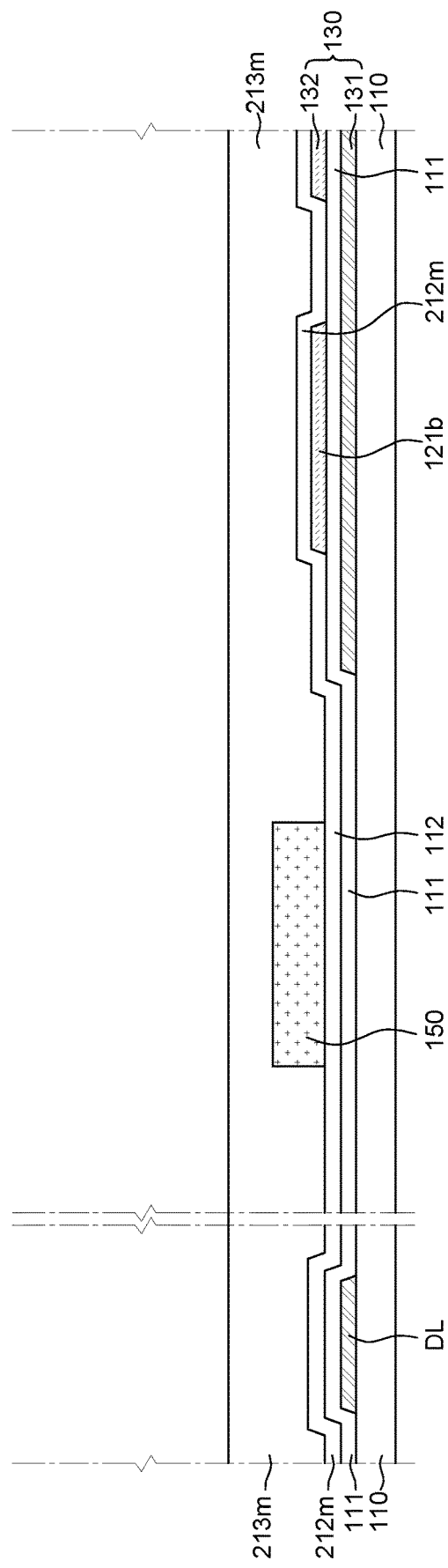
FIGS. 5A and 5B are schematic views of processes for explaining a display device and a manufacturing method of a display device according to another exemplary embodiment of the present disclosure.
Figure 5B:
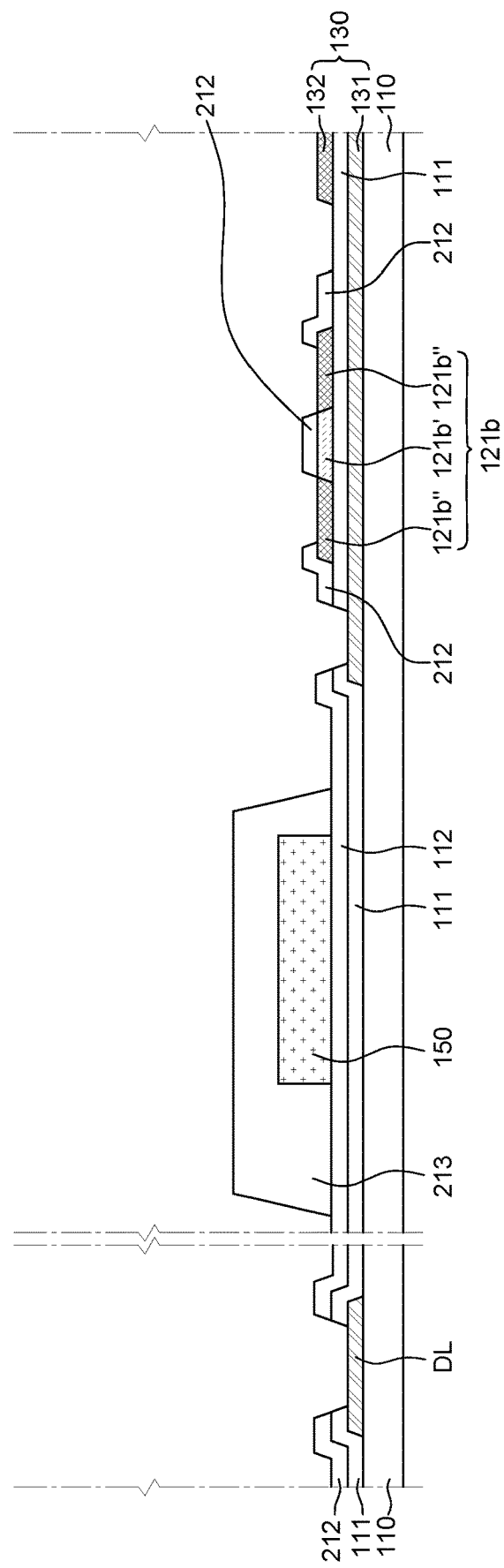

FIGS. 5A and 5B are schematic views of processes for explaining a display device and a manufacturing method of a display device according to another exemplary embodiment of the present disclosure. As compared with the display device of FIGS. 4A to 4G, in the display device of FIGS. 5A and 5B, only the third to seventh mask processes are different, but the other processes are substantially the same. Therefore, a redundant description will be omitted.

FIG. 5A is a cross-sectional view of a display device in which a gate insulating material 212m, a color filter 150, and a planarization material 213m are formed on a substrate 110 on which a second mask process for forming a second active layer 121b and the second capacitor electrode 132 is also completed.

Referring to FIG. 5A, first, the gate insulating material 212m is formed to cover the second active layer 121b and the buffer layer 111. Next, the color filter 150 is formed on the gate insulating material 212m. In this case, the color filter 150 may be formed on the gate insulating material 212m through a separate mask process. The mask process may be further added depending on the number of colors of the color filter 150. Finally, when the mask process for forming the color filter 150 is completed, the planarization material 213m is formed on the color filter 150 and the gate insulating material 212m.

FIG. 5B is a cross-sectional view of a display device in which the gate insulating material 212m and the planarization material 213m are etched using one mask process to completely form the gate insulating layer 212 and the planarization layer 213.

Referring to FIG. 5B, the gate insulating layer 212 and the planarization layer 213 are formed by one mask process. Specifically, as illustrated in FIG. 5A, when the gate insulating material 212m and the planarization material 213m are sequentially formed, the planarization material 213m formed above the gate insulating material 212m may be etched. For example, the planarization material 213m is etched in the area overlapping the non-active area NA, the first thin film transistor 120a, the second thin film transistor 120b, and the capacitor 130 through the mask process to form the planarization layer 213.

Next, the gate insulating material 212m may be etched sequentially after etching the planarization material 213m. In this case, the buffer layer 111 is also etched together with the gate insulating material 212m in some area.

For example, the gate insulating material 212m and the buffer layer 111 are etched in the area overlapping one end of the data line DL to form a contact hole through which the data line DL and the data pad electrode DPE are electrically connected. Simultaneously, in order to form the contact hole through which the first capacitor electrode 131 and the second drain electrode 124b are electrically connected, the buffer layer 111 and the gate insulating material 212m which cover the first capacitor electrode 131 may be etched. Further, the gate insulating material 212m which covers the second capacitor electrode 132 may be etched. Finally, the gate insulating material 212m which covers the second active layer 121b is etched to expose a part of the upper surface of the second active layer 121b to form a contact hole through which the second active layer 121b is electrically connected to the second source electrode 123b and the second drain electrode 124b.

Therefore, the gate insulating material 212m is etched in the area overlapping one end of the data line DL, a contact hole area through which the first capacitor electrode 131 and the second drain electrode 124b are electrically connected, and a contact hole area through which the second active layer 121b is electrically connected to the second source electrode 123b and the second drain electrode 124b to form the gate insulating layer 212.

In this case, the halftone mask is used to simultaneously etch the planarization material 213m and the gate insulating material 212m to form the planarization layer 213 and the gate insulating layer 212. Therefore, without separately using a mask for forming the planarization layer 213 and a mask for forming the gate insulating layer 212, the halftone mask is used to simultaneously form the planarization layer 213 and the gate insulating layer 212.

According to a display device and the manufacturing method of a display device according to another exemplary embodiment of the present disclosure, the gate insulating layer 212 and the planarization layer 213 are simultaneously formed, thereby simplifying the process. Specifically, the gate insulating material 212m and the planarization material 213m are sequentially formed. In the non-active area NA, the entire planarization material 213m is etched and the gate insulating material 212m is etched in a position of the data line DL where the data pad electrode DPE is formed. Further, the planarization material 213m is etched in an area overlapping the first thin film transistor 120a, the second thin film transistor 120b, and the capacitor 130. Further, in order to electrically connect the second active layer 121b with the second source electrode 123b and the second drain electrode 124b, the gate insulating material 212m is etched to partially expose the second active layer 121b. And the gate insulating material 212m is etched to expose the second capacitor electrode 132 from the gate insulating material 212m. Therefore, in the display device and the manufacturing method of a display device according to another exemplary embodiment of the present disclosure, the gate insulating layer 212 and the planarization layer 213 are not formed by different mask processes, but formed by one mask process. Therefore, the number of processes is reduced and the manufacturing cost and time may be reduced.

Figure 6:
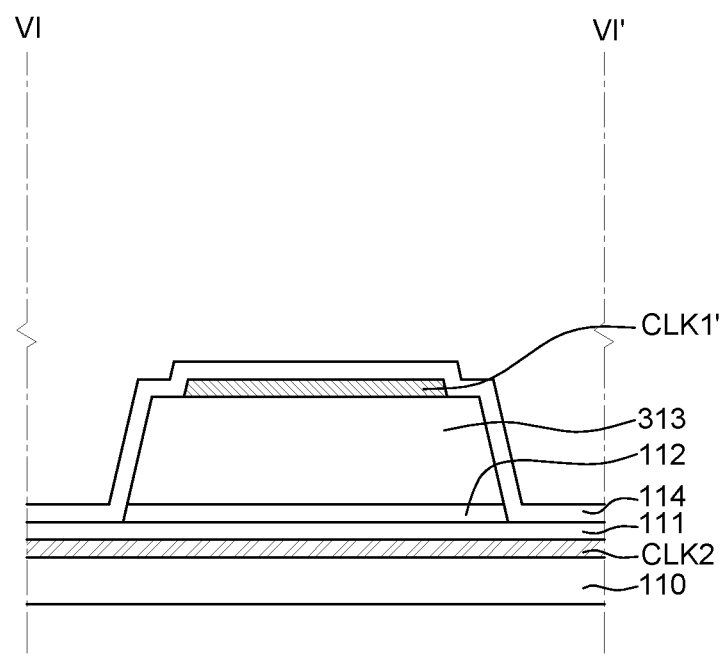
FIG. 6 is a cross-sectional view taken along the line VI-VI' of FIG. 1 in a display device according to another exemplary embodiment of the present disclosure.

FIG. 6 is a cross-sectional view taken along the line VI-VI' of FIG. 1 in a display device according to another exemplary embodiment of the present disclosure. The display device of FIG. 6 is different from the display device 100 of FIGS. 1 to 3 in that a second planarization layer 313 is further disposed in the non-active area NA, but other structures are substantially the same. Therefore, a redundant description will be omitted.

Referring to FIG. 6, a second planarization layer 313 is further disposed in the non-active area NA. For example, the planarization layer may include the first planarization layer 113 and the second planarization layer 313 and the first planarization layer 113 is disposed in the active area AA and the second planarization layer 313 is disposed in the non-active area NA.

The first planarization layer 113 has the substantially same configuration as the planarization layer 113 of FIGS. 1 to 3. The first planarization layer 113 is not disposed in the area overlapping the first thin film transistor 120a, the second thin film transistor 120b, and the capacitor 130 in the active area AA. The first planarization layer 113 is disposed to overlap only the color filter 150, the gate line GL, the data line DL, the power line PL, and the organic light emitting diode 140.

The second planarization layer 313 is disposed in the non-active area NA. Specifically, the second planarization layer 313 is disposed at intersections of the plurality of clock lines CLK1, CLK2, and CLK3 and the part of the plurality of clock lines CLK1', CLK2', and CLK3' which transmits the gate shift clock signal from the timing controller TC to the gate driver GD.

For example, in order to transmit the gate shift clock signal from the first clock line CLK1 which is disposed at the outermost side of the substrate 110 to the gate driver GD, the part of the first clock line CLK1' may be disposed across the second clock line CLK2 and the third clock line CLK3 which are disposed at an inner side of the substrate 110 more than the first clock line CLK1. In this case, the part of the first clock line CLK1', the second clock line CLK2, and the third clock line CLK3 are disposed on different layers to intersect in a specific area. Further, the second planarization layer 313 may be disposed at intersections between the plurality of clock lines CLK1, CLK2, and CLK3 and the part of the plurality of clock lines CLK1', CLK2', and CLK3'.

The second planarization layer 313 is disposed at an intersection of the part of the first clock line CLK1' and the second clock line CLK2. Specifically, the part of the first clock line CLK1' is disposed on the second planarization layer 313, and the second clock line CLK2 is disposed below the second planarization layer 313. Accordingly, the second planarization layer 313 increases a distance spaced between the part of the first clock line CLK1' and the second clock line CLK2 at a point where the part of the first clock line CLK1' and the second clock line CLK2 overlap each other, to reduce the parasitic capacitance.

In the meantime, the first planarization layer 113 is spaced apart from the second planarization layer 313. For example, the second planarization layer 313 is spaced apart from the first planarization layer 113 to be disposed to have an island shape in the non-active area NA. The first planarization layer 113 is formed of an organic material to be vulnerable to moisture. Therefore, if the first planarization layer 113 and the second planarization 313 are not spaced apart from each other but are connected, the moisture which is permeated to the second planarization layer 313 is transmitted to the active area AA, which may deteriorate the reliability of the display device. Therefore, since the first planarization layer 113 and the second planarization 313 are spaced apart from each other, even though the moisture is permeated to the second planarization layer 313, the moisture may hardly affect the first planarization layer 113. Therefore, the deterioration of the reliability of the display device due to the moisture may be minimized.

In a display device according to another exemplary embodiment of the present disclosure, the first planarization layer 113 is disposed in the active area AA and the second planarization layer 313 is disposed in the non-active area NA. Further, the first planarization layer 113 is spaced apart from the second planarization layer 313. The first planarization layer 113 and the second planarization layer 313 are formed of an organic material to be vulnerable to moisture. In this case, even though the moisture is permeated to the second planarization layer 313 disposed in the non-active area NA, the moisture may not be transmitted to the first planarization layer 113. Accordingly, even though the second planarization layer 313 is further disposed in the non-active area NA, the reliability deterioration due to the moisture in the active area AA may not be caused by the second planarization layer 313.

In this case, the second planarization layer 313 may be disposed at the intersections of the wiring lines in the non-active area NA. For example, in the non-active area NA, the part of the first clock line CLK1' and the second clock line CLK2 are disposed on different layers to intersect each other. The second planarization layer 313 may be disposed between the part of the first clock line CLK1' and the second clock line CLK2 at the intersection of the part of the first clock line CLK1' and the second clock line CLK2. Therefore, the part of the first clock line CLK1' is disposed above the second planarization layer 313 and the second clock line CLK2 is disposed below the second planarization layer 313 so that an interval between the part of the first clock line CLK1' and the second clock line CLK2 may be increased. Accordingly, in the display device according to another exemplary embodiment of the present disclosure, the second planarization layer 313 is also disposed in the non-active area to reduce the parasitic capacitance and interference due to the overlapping of the wiring lines and minimize the short circuit between the wiring lines.

The exemplary embodiments of the present disclosure can also be described as follows:

According to an aspect of the present disclosure, a display device includes: a substrate including an active area and a non-active area, a thin film transistor including an active layer disposed on the substrate, a gate electrode, a source electrode, and a drain electrode disposed on the active layer; and an organic light emitting diode including an anode which is electrically connected to the thin film transistor in which the gate electrode, the source electrode, and the drain electrode are formed of a first conductive layer and a second conductive layer on the first conductive layer and the anode is formed of the same material as the first conductive layer.

The anode may extend from the first conductive layer of the source electrode or the drain electrode.

The first conductive layer may be formed of a transparent conductive material and the second conductive layer may be formed of a metallic material.

The display device may further include a first planarization layer disposed between the substrate and the anode in an area of the active area excluding an area where the thin film transistor is disposed.

The display device may further include a color filter disposed between the substrate and the first planarization layer.

The display device may further include a second planarization layer disposed in the non-active area in which the first planarization layer and the second planarization layer may be spaced apart from each other.

The second planarization layer may be an island shape.

The display device may further include a data line which is disposed in the active area and disposed between the substrate and the active layer; and a data pad electrode which is disposed in the non-active area and is electrically connected to the data line in which the data pad electrode is formed of the same material as the first conductive layer.

The display device may further include a light shielding layer which is disposed to overlap the active layer of the thin film transistor and is formed of the same material as the data line. The overlapped parts between the light shielding layer and the active layer may constitute a capacitor. Further, the anode may be connected to the light shielding layer.

The display device may further include a passivation layer disposed on the thin film transistor in which the anode, the gate electrode, the source electrode, and the drain electrode are in contact with a lower surface of the passivation layer.

According to an aspect of the present disclosure, a manufacturing method of a display device includes: forming an active layer of a thin film transistor in an active area, on a substrate including the active area and a non-active area; forming a gate insulating layer on the active layer; sequentially forming a first conductive material and a second conductive material on the gate insulating layer; and forming a gate electrode, a source electrode, and a drain electrode of the thin film transistor which are formed of a first conductive layer and a second conductive layer on the first conductive layer, on the active layer by etching the first conductive material and the second conductive material and forming an anode of an organic light emitting diode which is formed of the same material as the first conductive layer.

The first conductive material may be formed of a transparent conductive material and the second conductive material may be formed of a metallic material.

The forming of the gate electrode, the source electrode, and the drain electrode of the thin film transistor and the anode includes integrally forming the anode and the first conductive layer of the source electrode or the drain electrode.

The manufacturing method may further include forming a data line between the substrate and the active layer in the active area and the forming of the gate electrode, the source electrode, and the drain electrode of the thin film transistor and the anode may include forming a pad electrode which is electrically connected to the data line in the non-active area and is formed of the first conductive material.

The forming of the data line may include forming a light shielding layer which is formed of the same material as the data line in an area overlapping the active layer.

The forming of the gate insulating layer may include sequentially forming a gate insulating material and a planarization material on the active layer, forming a planarization layer by etching the planarization material in the non-active area and an area overlapping the thin film transistor; and forming the gate insulating layer in an area where the planarization material is etched by etching the gate insulating material in an area where the active layer is in contact with the source electrode and the drain electrode and the forming of the gate electrode, the source electrode, and the drain electrode of the thin film transistor and the anode includes forming the anode on the planarization layer.

The sequentially forming of the gate insulating material and the planarization material may include forming the gate insulating material on the active layer, forming a color filter on the gate insulating material in an area overlapping the organic light emitting diode; and forming the planarization material on the color filter.

The manufacturing method may further include: sequentially forming a passivation material and a bank material on the thin film transistor and the anode, forming a bank by etching the bank material in an area overlapping at least a partial area of the anode and an area overlapping the non-active area, and forming a passivation layer by etching the passivation material in an area overlapping at least a partial area of the anode.

Although the exemplary embodiments of the present disclosure have been described in detail with reference to the accompanying drawings, the present disclosure is not limited thereto and may be embodied in many different forms without departing from the technical concept of the present disclosure. Therefore, the exemplary embodiments of the present disclosure are provided for illustrative purposes only but not intended to limit the technical concept of the present disclosure. The scope of the technical concept of the present disclosure is not limited thereto. Therefore, it should be understood that the above-described exemplary embodiments are illustrative in all aspects and do not limit the present disclosure. The protective scope of the present disclosure should be construed based on the following claims, and all the technical concepts in the equivalent scope thereof should be construed as falling within the scope of the present disclosure.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

What is claimed is:

1. A display device, comprising:
    a substrate including an active area and a non-active area;
    a thin film transistor including an active layer, a gate electrode, a source electrode, and a drain electrode disposed on the substrate;
    an anode for an organic light emitting diode, the anode being electrically connected to the thin film transistor;
    a gate line disposed on the active layer;
    a data line which is disposed in the active area and disposed between the substrate and the active layer;
    a power line for supplying a power voltage to the organic light emitting diode and which is disposed on the same layer as the data line; and
    a first planarization layer which is disposed to overlap only the gate line, the data line, the power line, and the organic light emitting diode,
    wherein the gate electrode, the source electrode, and the drain electrode are formed of a first conductive layer and a second conductive layer on the first conductive layer,
    the anode is formed of the same material as the first conductive layer and is located on the planarization layer, and
    the gate line is formed of the same material and on the same layer as the gate electrode, the source electrode, and the drain electrode.

2. The display device according to claim 1, further comprising:
    a color filter disposed between the substrate and the first planarization layer.

3. The display device according to claim 1, wherein the anode extends from the first conductive layer of the source electrode or the drain electrode.

4. The display device according to claim 1, wherein the first conductive layer is formed of a transparent conductive material and the second conductive layer is formed of a metallic material.

5. The display device according to claim 1, further comprising:
    a second planarization layer disposed in the non-active area,
    wherein the first planarization layer and the second planarization layer are spaced apart from each other.

6. The display device according to claim 5, wherein the second planarization layer is an island shape.

7. The display device according to claim 1, further comprising:
    a data pad electrode which is disposed in the non-active area and is electrically connected to the data line,
    wherein the data pad electrode is formed of the same material as the first conductive layer.

8. The display device according to claim 1, further comprising:
    a light shielding layer which is disposed to overlap the active layer of the thin film transistor and is formed of the same material as the data line.

9. The display device according to claim 8, wherein the light shielding layer is disposed on a same layer as the data line, and overlapped parts between the light shielding layer and the active layer constitute a capacitor.

10. The display device according to claim 8, wherein the anode is connected to the light shielding layer.

11. The display device according to claim 1, further comprising:
    a passivation layer disposed on the thin film transistor,
    wherein the anode, the gate electrode, the source electrode, and the drain electrode are in contact with a lower surface of the passivation layer.

12. The display device according to claim 1, further comprising:
    a gate pad electrode which is disposed in the non-active layer and is electrically connected to the gate line; and
    a power pad electrode which is disposed in the non-active area and is electrically connected to the power line,
    wherein the gate pad electrode is formed of the same material as the first conductive layer,
    the power pad electrode is formed of the same material as the first conductive layer.

13. The display device according to claim 1, wherein the gate line is perpendicular to the data line, and
    wherein the power line is disposed in parallel with the data line.

14. A display device, comprising:
    a substrate including an active area and a non-active area;
    a thin film transistor including an active layer, a gate electrode, a source electrode, and a drain electrode disposed on the substrate;
    an anode for an organic light emitting diode, the anode being electrically connected to the thin film transistor;
    a first planarization layer disposed between the substrate and the anode in an area of the active area excluding an area where the thin film transistor is disposed; and
    a first clock line and a second clock line,
    wherein the gate electrode, the source electrode, and the drain electrode are formed of a first conductive layer and a second conductive layer on the first conductive layer,
    the anode is formed of the same material as the first conductive layer, and
    the first clock line is disposed on a different layer from the second clock line, and a part of the first clock line extends to a gate driver of the display device and intersects a part of the second clock line to transmit a gate shift clock signal to the gate driver.

15. The display device according to claim 14, further comprising:
    a gate insulating layer on the substrate; and
    a second planarization layer disposed on the gate insulating layer in the non-active area,
    wherein the gate insulating layer and the second planarization layer are interposed between the intersected parts of the first clock line and the second clock line.

* * * * *